US010910295B2

(12) United States Patent
Cadag et al.

(10) Patent No.: US 10,910,295 B2
(45) Date of Patent: Feb. 2, 2021

(54) QFN PRE-MOLDED LEADFRAME HAVING A SOLDER WETTABLE SIDEWALL ON EACH LEAD

(71) Applicant: STMicroelectronics, Inc., Calamba (PH)

(72) Inventors: Aaron Cadag, Calamba (PH); Ernesto Antilano, Jr., Binan (PH); Ela Mia Cadag, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 16/712,789

(22) Filed: Dec. 12, 2019

(65) Prior Publication Data

US 2020/0135623 A1 Apr. 30, 2020

Related U.S. Application Data

(60) Continuation of application No. 16/107,807, filed on Aug. 21, 2018, now Pat. No. 10,541,196, and a
(Continued)

(51) Int. Cl.
*H01L 23/495* (2006.01)
*H01L 23/31* (2006.01)
(Continued)

(52) U.S. Cl.
CPC .... *H01L 23/49541* (2013.01); *H01L 21/4853* (2013.01); *H01L 21/565* (2013.01); *H01L 21/78* (2013.01); *H01L 23/3121* (2013.01); *H01L 23/3192* (2013.01); *H01L 23/4952* (2013.01); *H01L 23/49503* (2013.01);
(Continued)

(58) Field of Classification Search
CPC .......... H01L 23/49548; H01L 23/3121; H01L 23/49541; H01L 2224/48247; H01L 2224/73265; H01L 21/565; H01L 21/561; H01L 23/49861; H01L 23/495; H01L 23/49503; H01L 2224/48091; H01L 2924/181; H01L 21/78; H01L 23/4952;
(Continued)

(56) References Cited

U.S. PATENT DOCUMENTS 6,545,332 B2 4/2003 Huang
7,262,491 B2 8/2007 Islam et al.
(Continued)

*Primary Examiner* — Jasmine J Clark
(74) *Attorney, Agent, or Firm* — Seed IP Law Group LLP

(57) ABSTRACT

The present disclosure is directed to a leadframe package having solder wettable sidewalls that is formed using a pre-molded leadframe and methods of manufacturing the same. A metal plated leadframe with a plurality of recesses and a plurality of apertures is placed into a top and bottom mold tool. A molding compound is then formed in the plurality of recesses and apertures in the leadframe to form a pre-molded leadframe. A plurality of die and wires are coupled to the pre-molded leadframe and the resulting combination is covered in an encapsulant. Alternatively, a bare leadframe can be processed and the metal layer can be applied after encapsulation. A saw or other cutting means is used for singulation to form leadframe packages. Each resulting leadframe package has a solder wettable sidewall for improving the strength of solder joints between the package and a circuit board.

20 Claims, 6 Drawing Sheets

Related U.S. Application Data division of application No. 15/610,088, filed on May 31, 2017, now Pat. No. 10,079,198.

(51) Int. Cl.
*H01L 21/48* (2006.01)
*H01L 23/498* (2006.01)
*H01L 21/56* (2006.01)
*H01L 21/78* (2006.01)

(52) U.S. Cl.
CPC .. *H01L 23/49582* (2013.01); *H01L 23/49861* (2013.01); *H01L 21/561* (2013.01); *H01L 23/49548* (2013.01); *H01L 2224/48091* (2013.01); *H01L 2224/48247* (2013.01); *H01L 2224/73265* (2013.01); *H01L 2224/97* (2013.01); *H01L 2924/181* (2013.01)

(58) Field of Classification Search
CPC ........... H01L 23/49582; H01L 23/3192; H01L 2224/97
See application file for complete search history.

(56) References Cited

U.S. PATENT DOCUMENTS

| | | |
|---|---|---|
| 8,551,820 B1 | 10/2013 | Foster et al. |
| 2007/0111379 A1 | 5/2007 | Shim et al. |
| 2012/0205790 A1 | 8/2012 | Haga |
| 2016/0172277 A1* | 6/2016 | Lee .................... H01L 23/3121 257/676 |
| 2017/0073221 A1 | 3/2017 | Huang et al. |

* cited by examiner

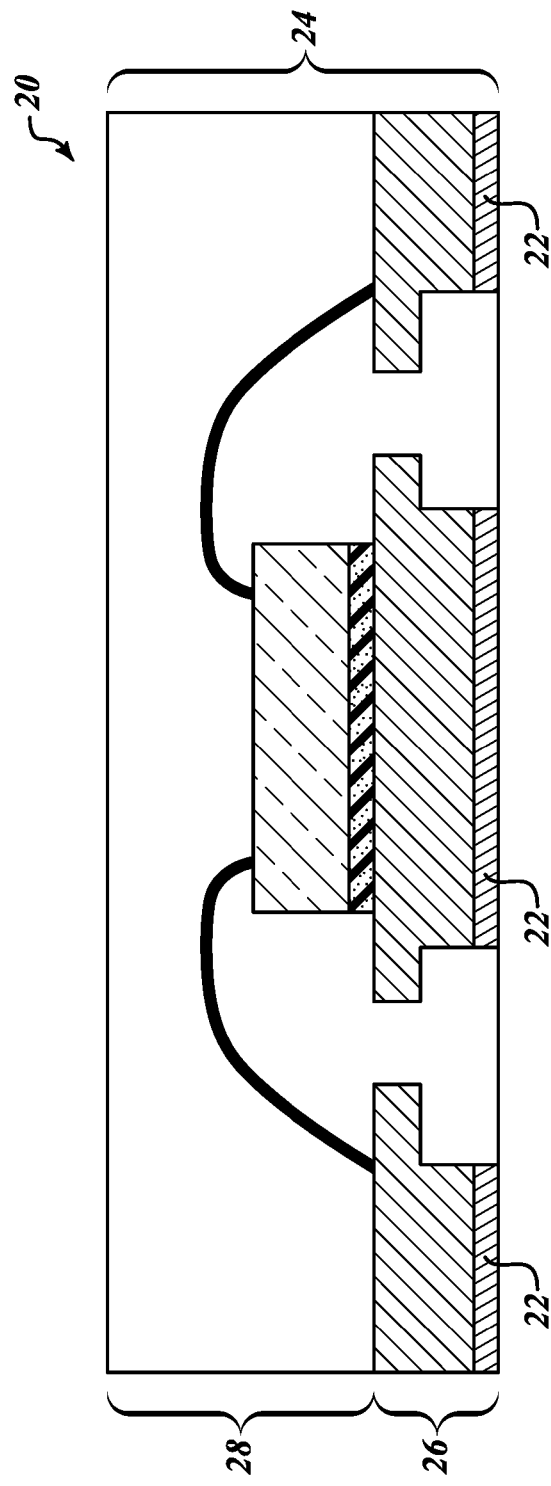
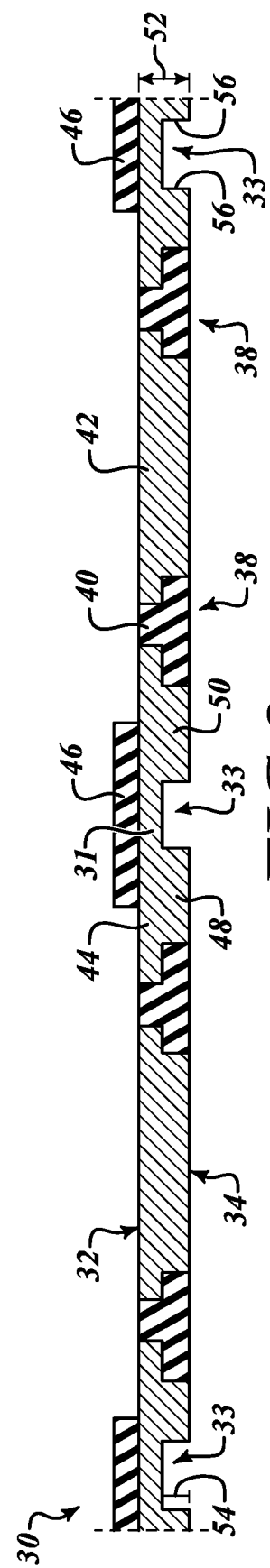

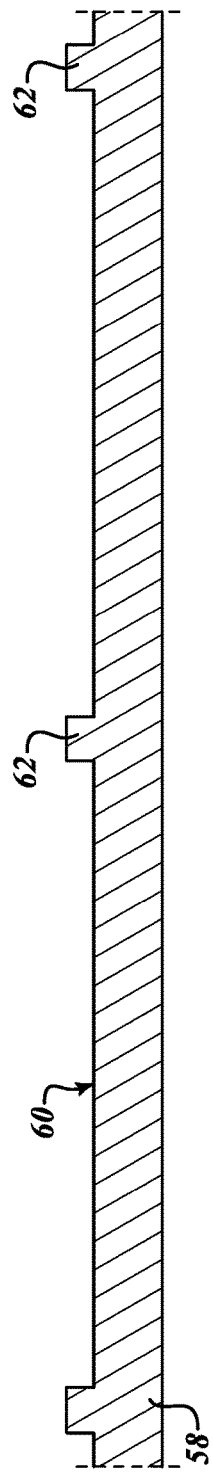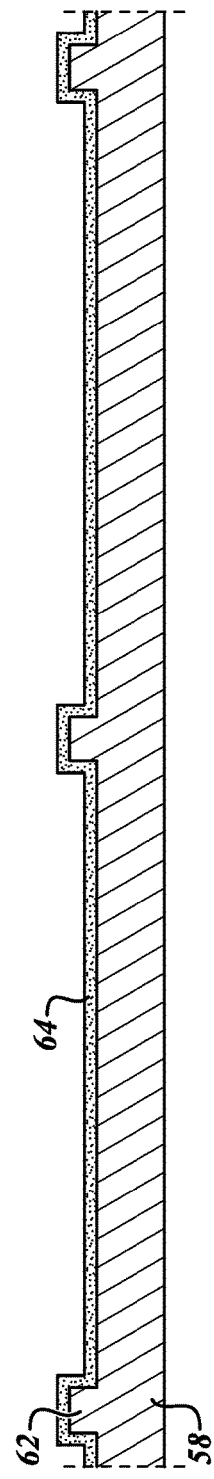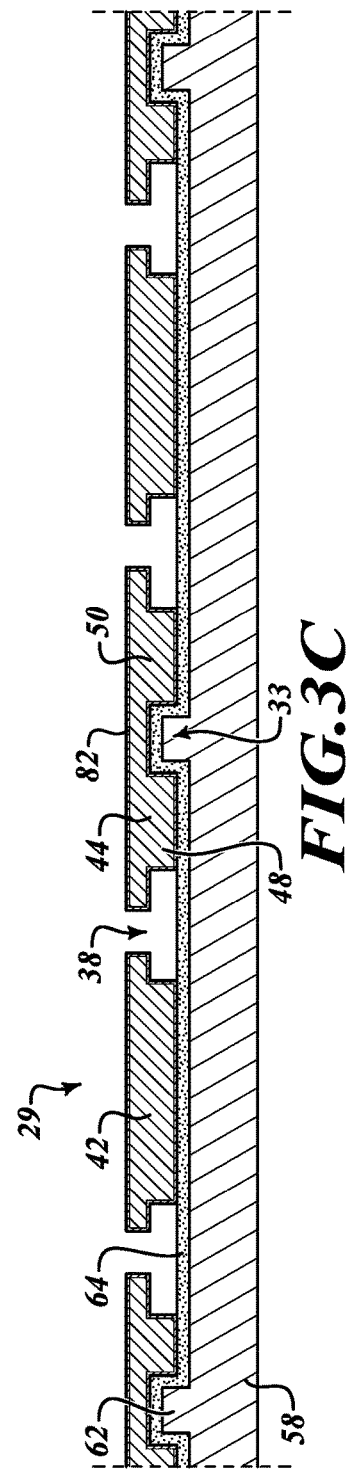

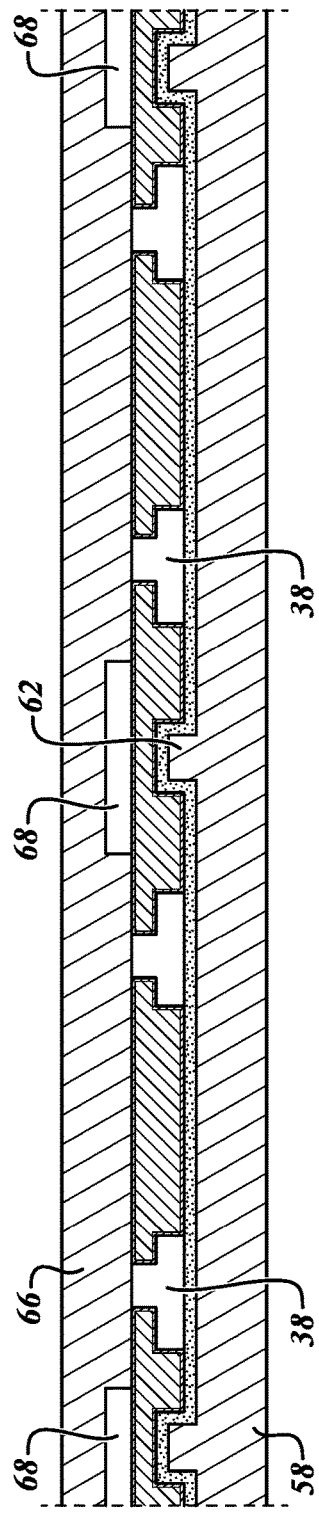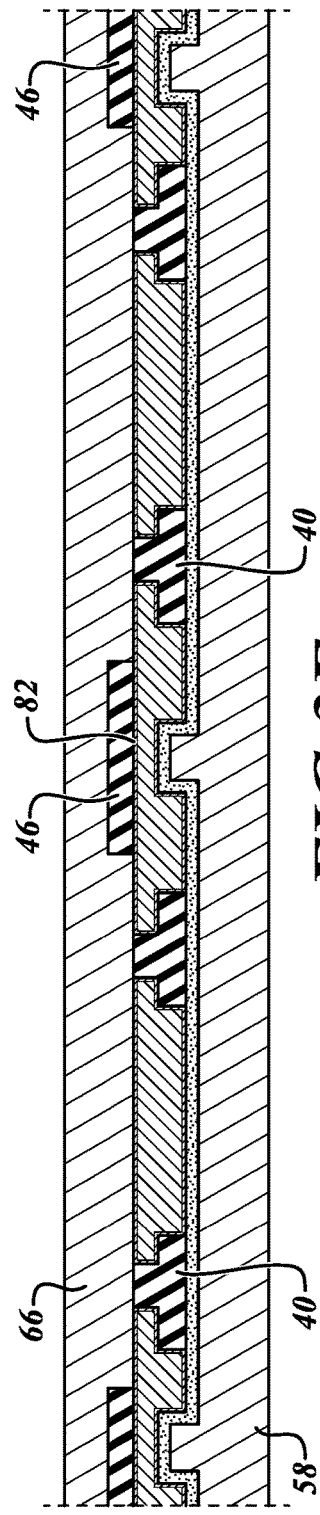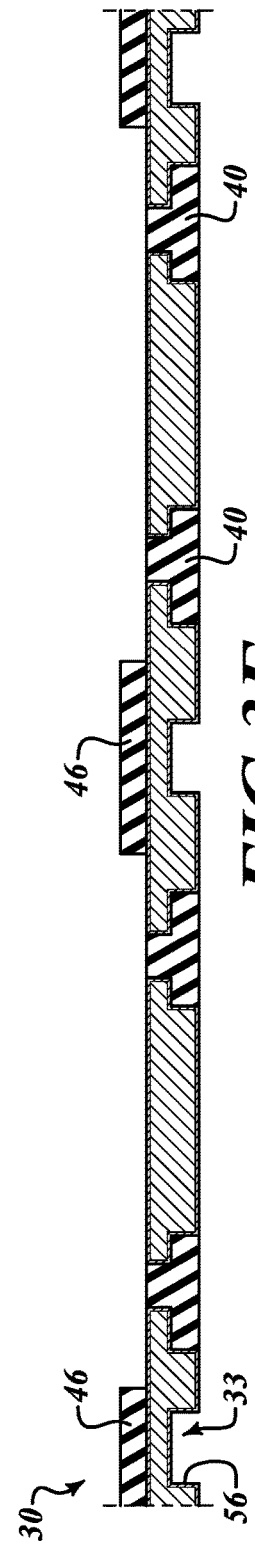

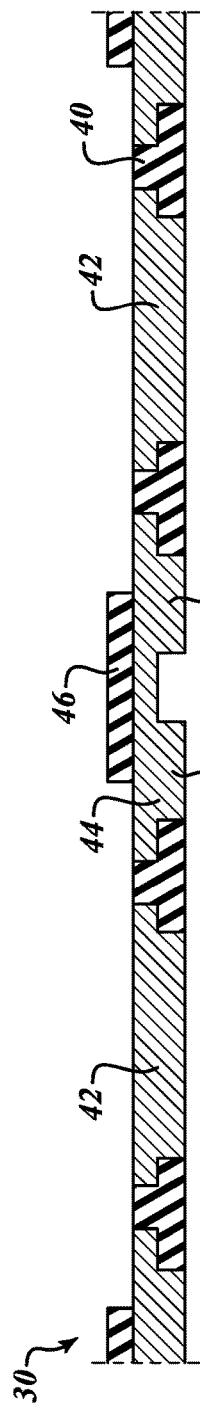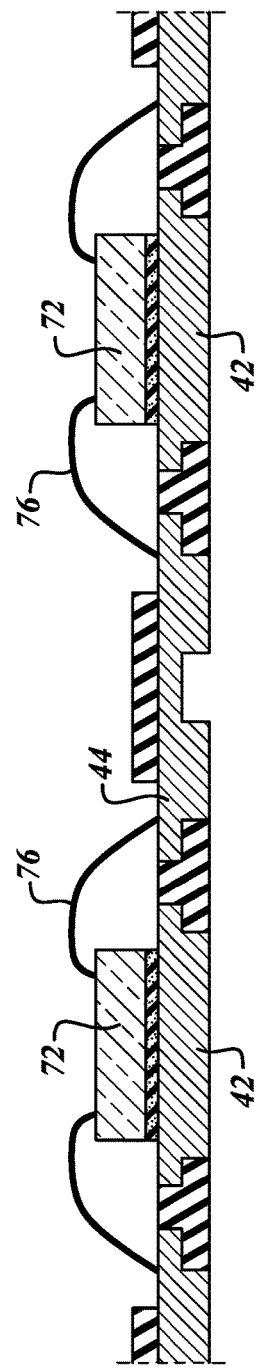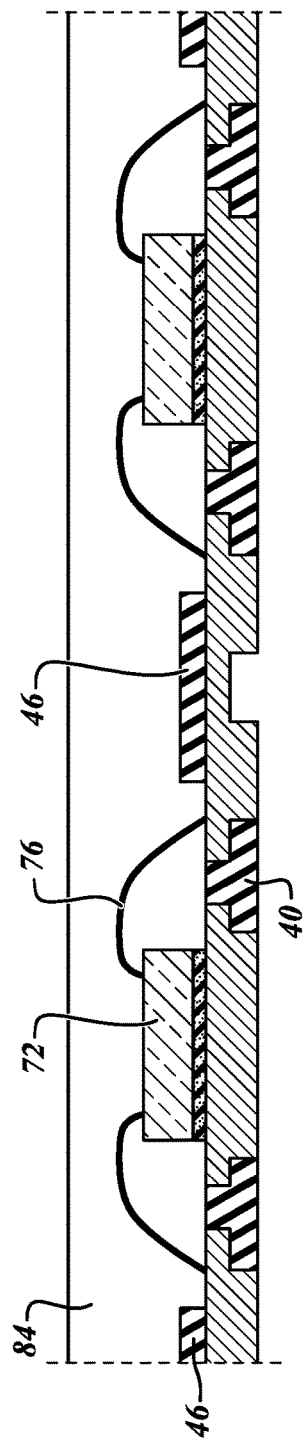

QFN PRE-MOLDED LEADFRAME HAVING A SOLDER WETTABLE SIDEWALL ON EACH LEAD

BACKGROUND

Technical Field

The present disclosure is directed to a leadframe package with a solder wettable sidewall formed using a pre-molded leadframe and methods of manufacturing the same.

Description of the Related Art

A typical semiconductor package includes a die coupled to a leadframe and various electrical contacts. The resulting combination is then covered with an encapsulant to create the package. Lands (also referred to as leads) located on a bottom surface of the package and, in many cases, side surfaces of the package provide electrical connection to a circuit board, such as a printed circuit board (PCB). When coupling the package to the PCB, the packages are mounted directly on the surface of the PCB using surface mount technology (SMT).

Although SMT allows for smaller packages, it also creates some disadvantages. In particular, the solder joints between the package and the PCB can be weakened due to the PCB and the package having different coefficients of thermal expansions (CTE). Thus, the reliability of the package may in some cases depend on the integrity of the solder joints and therefore, stronger solder joints are desired. But, most surface mount leadframes only have solder wettable material on the bottom of the package. The sidewalls of the package are often comprised of material that is incompatible with solder, which results in weak solder joints, or no solder joints, between the PCB and the sidewalls of the package. Finally, in some cases, the force of manufacturing processes in select locations of the thin metal leadframe results in leadframe bouncing, which may cause the thin metal of the leadframe to crack or fracture.

Past responses to these issues have been to add additional elements to the package. These solutions are often cost-prohibitive because adding additional elements increases the number of steps in the manufacturing process, which decreases efficiency and necessarily increases the per unit manufacturing cost of each package. Further, many solutions prevent the package from being inspected by Automatic Visual Inspection (AVI), which can result in lower package reliability and cycle life because the solder joints cannot be properly inspected before leaving the manufacturing facility.

These issues are embodied in a typical semiconductor package 20, as shown in FIG. 1. The package 20 has a metal layer 22 on a bottom surface of certain portions of the package 20. The package 20 also has sidewalls 24 with a first portion 28 comprised of encapsulant and a second portion 26 comprised of lead. As such, when the package 20 is attached to a PCB or other circuit board, no solder joints can be formed between the PCB and the sidewalls 24 because both the encapsulant and the lead are comprised of material that is incompatible with solder. As a result, solder joints cannot be formed between the PCB and the sidewall 24 of the package 20, which reduces the strength of the solder joints in the package 20 and prevents the package 20 from being inspected by AVI. The net outcome is a less reliable package.

BRIEF SUMMARY

Embodiments of the present disclosure are directed to leadframe packages having a solder wettable sidewall that are formed using a pre-molded leadframe and methods of manufacturing the same. In one embodiment, a pre-molded leadframe is formed by using a bottom mold tool having a plurality of ridges. A mold release film is placed over a first surface of the bottom mold tool and each of the ridges. Then, a leadframe is formed with a plurality of recesses having a size and shape to match the ridges and having a plurality of apertures between die pads and the leads of the leadframe. After forming the plurality of apertures and recesses, a metal layer is formed on the leadframe, such that the metal layer surrounds each die and each lead. The leadframe is then placed on the bottom mold tool and a top mold tool with a plurality of cavities is placed on the other side of the leadframe.

With the molds in place, molding compound is formed in the apertures between the die pads of the leadframe and in the cavities of the top mold tool. When the top and bottom mold tools are released, a pre-molded leadframe remains with molding compound in the plurality of apertures and on a first surface of the leadframe. The molding compound in the pre-molded leadframe provides additional support to the leadframe above the plurality of recesses, which prevents leadframe bouncing during processing and thereby reduces the likelihood of leadframe damage during incorporation of the leadframe into a package. Once the pre-molded leadframe is formed, the leadframe is incorporated into a package by coupling one or more die to each die pad and coupling a plurality of wires between each die and the metal layer on one or more leads. Then, an encapsulant is formed over the die, the wires and the pre-molded leadframe. The resulting combination is then separated with a mechanical blade or other cutting means at the plurality of recesses to form packages with solder wettable sidewalls.

In another embodiment, a pre-molded leadframe with a plurality of recesses on a first surface is incorporated into a leadframe package. A plurality of die are coupled to the pre-molded leadframe on a second surface and a plurality of wires are coupled between each die and one or more leads. An encapsulant is then used to cover the die, the wires, and the pre-molded leadframe. Next, a metal layer is formed on the first surface of the leadframe, including each of the plurality of recesses. A saw or other cutting means is then used to separate the resulting combination at the plurality of recesses. The result is a leadframe package having a solder wettable sidewall formed using a pre-molded leadframe.

When a package with solder wettable sidewalls is mounted to a PCB or other circuit board, the solder wettable sidewalls enable strong solder joints to be formed between the leads of the package and the PCB. This also increases the solder contact area between the package and the PCB, which results in less resistance and a lower thermal load per solder pin. This reduced thermal load allows for a reduction in the number of pins required to handle the power supply load. If fewer pins are required to carry the positive and negative power supplies, then the package can be made with fewer pins, saving money. It also allows for an increase in the number of signal and data pins in the resulting device, if needed.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

FIG. 1 is a cross-sectional view of a leadframe package as is known in the prior art;

FIG. 2 is a cross-sectional view of an exemplary embodiment of a pre-molded leadframe;

FIGS. 3A-F are cross-sectional views of various stages of an assembly process of pre-molded leadframe assembly process, such as the pre-molded leadframe of FIG. 2, in accordance with an exemplary embodiment of the present disclosure;

FIGS. 5A-E are cross-sectional views of various stages of an assembly process of leadframe packages with solder wettable sidewalls and formed using a pre-molded leadframe, such as the leadframe package of FIG. 4, in accordance with an exemplary embodiment of the present disclosure.

DETAILED DESCRIPTION

Figure 4:
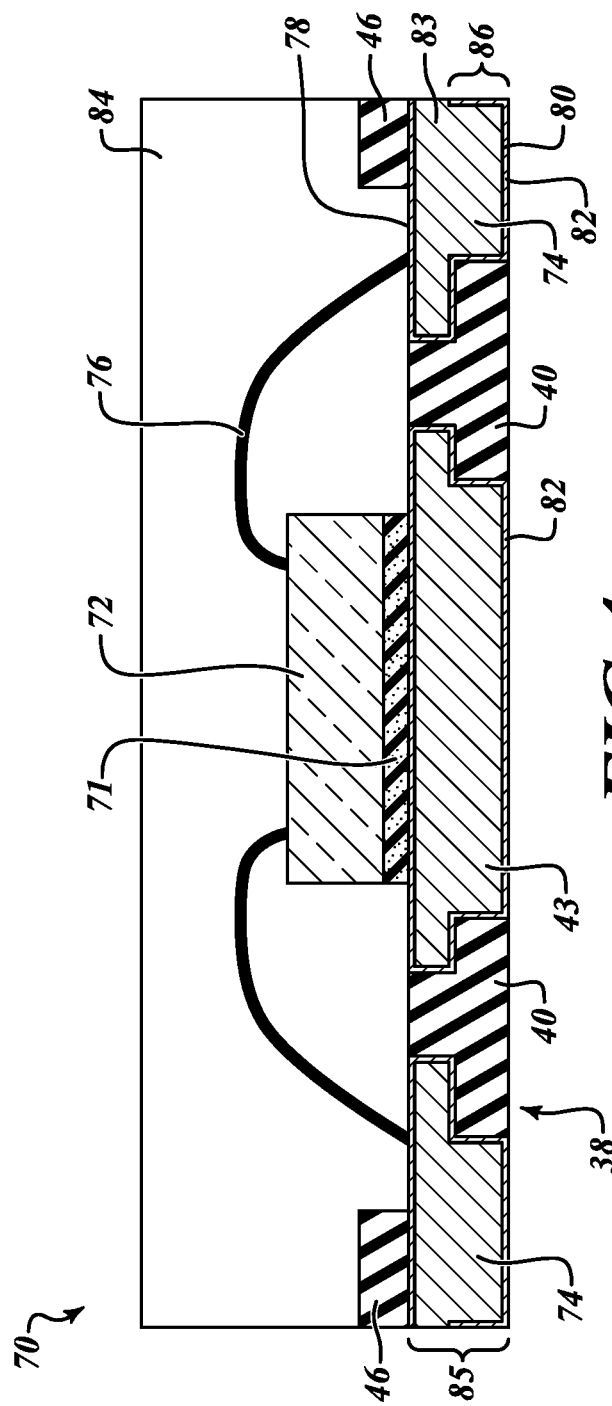
FIG. 4 is a cross-sectional view of an exemplary embodiment of a leadframe package with solder wettable sidewalls formed using a pre-molded leadframe.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure. The drawings are not necessarily drawn to scale and some features are enlarged to provide a more clear view of particular features.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The present disclosure is generally directed to providing a leadframe package with a solder wettable sidewall that is formed using a pre-molded leadframe. An exemplary embodiment of a pre-molded leadframe 30 is shown in FIG. 2. In this embodiment, the pre-molded leadframe 30 has a first side 32 and a second side 34. The leadframe 30 also has a plurality of die pads 42 and a plurality of leads 44. Each of the plurality of leads 44 comprises a first lead 48 and a second lead 50 joined together by a thin section of leadframe 31. A thickness of the section of leadframe 31 will vary depending on a depth 54 of a plurality of recesses 33 formed in the second side 34 of the pre-molded leadframe 30, as described in more detail below. The depth 54 also comprises a certain percentage of a thickness 52 of the pre-molded leadframe 30. In some embodiments, the depth 54 is more than 50% of the thickness 52, although other variations may be selected depending on the desired characteristics of the leadframe 30.

The plurality of die pads 42 are separated by a plurality of apertures 38. In this embodiment, the plurality of apertures 38 are filled with a first plurality of molding compound portions 40. A second plurality of molding compound portions 46 are placed on the first side 32 of the pre-molded leadframe 30 at a location that is adjacent to the plurality of recesses 33 that are formed on the second side 34 of the leadframe between the first lead 48 and the second lead 50 of each of the plurality of leads 44. The plurality of recesses 33 define sidewalls 56 that are exposed to an exterior environment. When the pre-molded leadframe 30 is formed into a package, as described below, the sidewalls 56 are covered by a metal layer to create packages with solder wettable sidewalls. In an alternative embodiment, the metal layer is formed on each of the plurality of die pads 42 and each of the plurality of leads 44 prior to forming the first and second plurality of molding compound portions, as in FIGS. 3C-F.

The first plurality of molding compound portions 40 and the second plurality of molding compound portions 46 each provide support to the pre-molded leadframe 30 when the leadframe undergoes additional processing. A typical leadframe is a very thin, wide layer of copper or other metal that is likely to crack or fracture during the die and wire attach processes, or during other steps in manufacturing. Usually this damage is the result of leadframe bouncing, which occurs after a force is applied in a certain area of the leadframe and the effects of the force spread throughout the leadframe, causing the thin material to bounce. The first plurality of molding compound portions 40 and the second plurality of molding compound portions 46 provide additional material in vulnerable locations of the leadframe 30. This increased area of material results in lower stresses for the leadframe 30 when subjected to the same forces inherent in the manufacturing process. As a result, the likelihood of cracking or fracture is greatly reduced. The stress is further reduced by the molding compound material itself, which acts as a buffer to absorb vibrations that occur due to leadframe bouncing or other manufacturing induced forces.

An exemplary embodiment of a method of manufacturing the pre-molded leadframe 30 is shown in FIGS. 3A-F. In the embodiment that begins in FIG. 3A, a bottom mold tool 58 is formed with a plurality of ridges 62 on a first surface 60 of the bottom mold tool 58. The bottom mold tool 58 is comprised of metal, or another suitable material, and a size and a shape of each of the plurality of ridges 62 can vary according to design preferences or the particular application for the resulting pre-molded leadframe. Then, in FIG. 3B, a mold release film 64 is placed over the first surface 60 of the bottom mold tool 58, including each of the plurality of ridges 62. The mold release film 64 is non-adhesive and prevents the leadframe from adhering to the bottom mold tool 58 when molding compound is formed on the leadframe.

Once the mold release film 64 is in place, a leadframe 29 is placed on the bottom mold tool 58 and the mold release film 64, as shown in FIG. 3C. The leadframe 29 includes a plurality of die pads 42 and a plurality of leads 44. The plurality of die pads 42 are separated from the plurality of leads 44 by a plurality of apertures 38 that are formed in the leadframe 29 prior to placement. The plurality of leads 44 are separated into the first lead 48 and the second lead 50 of each of the plurality of leads 44 by a first plurality of recesses 33. The first plurality of recesses 33 are formed with a size and a shape configured to receive the plurality of ridges 62. Each of the plurality of apertures 38 and the first plurality of recesses 33 may be formed using wet or dry etching, laser etching, or using a mechanical blade, in addition to other alternatives. After the plurality of apertures 38 and the first plurality of recesses 33 are formed in the leadframe 29, a metal layer 82 is positioned on each die pad 42 and each lead 44. The leadframe 29 is coated in the metal layer 82, such that the metal layer 82 is positioned on each surface of each die pad 42 and each lead 44. The metal layer 82 may be comprised of any suitable layer or combination of layers that form a strong connection with solder, namely a layer that is wettable to solder. For example, the layer 82 might be tin or an alloy of tin. Alternatively, the layer 82 might be a bi-layer of nickel and gold or a tri-layer of nickel, palladium, and gold.

The solder wettable layer 82 can be applied at any one of various different stages in the process. In the embodiment of FIG. 2, the layer 82 is applied after the pre-molded lead frame is fully formed, but before the die is attached. Thus, the layer 82 is not shown in FIG. 2, but will be applied as the next step. In the embodiment of FIG. 3C, the layer 82 is applied to the lead frame before it is placed in the mold for the first time. In further alternative embodiments, it can be applied before the die pads and leads of the lead frame are formed and etched or after the etching step. It can also be applied after the die is attached and after the final encapsulation step.

With the leadframe 29 in place, a top mold tool 66 is placed over the leadframe 29, as in FIG. 3D. The top mold tool 66 has a second plurality of recesses 68. The second plurality of recesses 68 are positioned above the first plurality of recesses 33 such that molding compound can be formed on the leadframe 29. This provides a passage way for the molding compound to more completely flow around the lead frame 29 to fill the apertures 38 and also provides additional rigidity and support to the area of leadframe above the first plurality of recesses 33. If the recess 33 is quite deep, then having the block of molding compound directly over each recess will add stiffness and provide better handling of the lead frame during the manufacturing process. The plurality of ridges 62 provide support for the leadframe during the formation of molding compound on the leadframe. Once the top mold tool 66 and the bottom mold tool 58 are secure, the first plurality of molding compound portions 40 and the second plurality of molding compound portions 46 are formed in the plurality of apertures 38 and the second plurality of recesses 68, respectively, as in FIG. 3E. The second plurality of molding compound portions 46 contact the metal layer 82 on a surface of each lead 44 and the first plurality of molding compound portions 40 contact the metal layer on one die pad 42 and one lead 44.

Once the first plurality of molding compound portions 40 and the second plurality of molding compound portions 46 are formed, the bottom mold tool 58 and the top mold tool 66 are released and the pre-molded leadframe 30 is removed from the mold tools, as in FIG. 3F. The resulting pre-molded leadframe 30 has the first plurality of molding compound portions 40 and the second plurality of molding compound portions 46 to protect against the effects of leadframe bouncing when the pre-molded leadframe 30 undergoes additional manufacturing to become integrated into a leadframe package. In addition, sidewalls 56 of each of the first plurality of recesses 33 are covered by the metal layer 82. When the pre-molded leadframe 30 is formed into a leadframe package, the sidewalls are exposed on a portion of a sidewall of the package, and the metal layer 82 on the sidewalls of the package allows for the formation of strong solder joints between sidewalls of the package and the PCB or other board.

An exemplary embodiment of a leadframe package 70 with solder wettable sidewalls that is formed using a pre-molded leadframe is shown in FIG. 4. In this embodiment, the leadframe package 70 includes a die 72 coupled to a die pad 43 with a tape or other suitable adhesive 71 and a plurality of leads 74 spaced apart from the die pad 43. Each of the plurality of leads 74 includes a first side 78, a second side 80 and a sidewall 85. The lead sidewall 85 includes a flange 83 and a lead portion 86. A metal layer 82 extends around each surface of the die pad 43 and around the first side 78, the second side 80 and the portion 86 of each lead 74. A plurality of wires 76 are coupled between the die 72 and the metal layer 82 on one or more of the plurality of leads 74. The metal layer 82 may be one or more of tin, nickel, palladium, or gold, although other metals or materials may also be useful according to the design requirements. The metal layer 82 on the lead portion 86 of the sidewall 85 allows for solder joints to form between a sidewall of the package 70 and the PCB or other board. Presence of solder on the sidewall of the package allows for formation of solder joints between the sidewall and the PCB and also allows for inspection by AVI, which helps identify flaws and other issues before the package and board leave the manufacturing or testing facility, which further increases reliability.

The plurality of leads 74 are spaced apart from the die pad 43 by the plurality of apertures 38. The plurality of apertures 38 are filled with the first plurality of molding compound portions 40, which may be formed using the process described above with reference to the pre-molded leadframe. The leadframe package 70 also includes a portion of one or more of the second plurality of molding compound portions 46 on the first side 78 of the plurality of leads 74.

The die 72, the plurality of wires 76 and the second plurality of molding compound portions 46 are encapsulated by an encapsulant 84. Once the first plurality of molding compound portions 40 and the second plurality of molding compound portions 46 are cured through the forming process, the application of heat and pressure to form the encapsulant 84 will not cause the first and second plurality of molding compound portions 40, 46 to melt or degrade. In other words, the melting or degradation temperature of the first and second plurality of molding compound portions 40, 46 after curing is below the temperature at which the encapsulant 84 is placed.

In the embodiment of FIG. 4, the layer 82 was applied prior to the pre-molded leadframe being formed, similar to the sequence shown in FIG. 3C.

In an alternative embodiment, the sidewall 85 is substantially vertical and the lead portion 86 includes the sidewall 85 and the flange 83, as described below. As a result, the entire sidewall 85 is covered by the metal layer 82. A width or height of the flange 83 may vary depending if a deeper recess is cut into the second side of each of the plurality of leads, as described above with reference to the pre-molded leadframe.

Figure 5D:
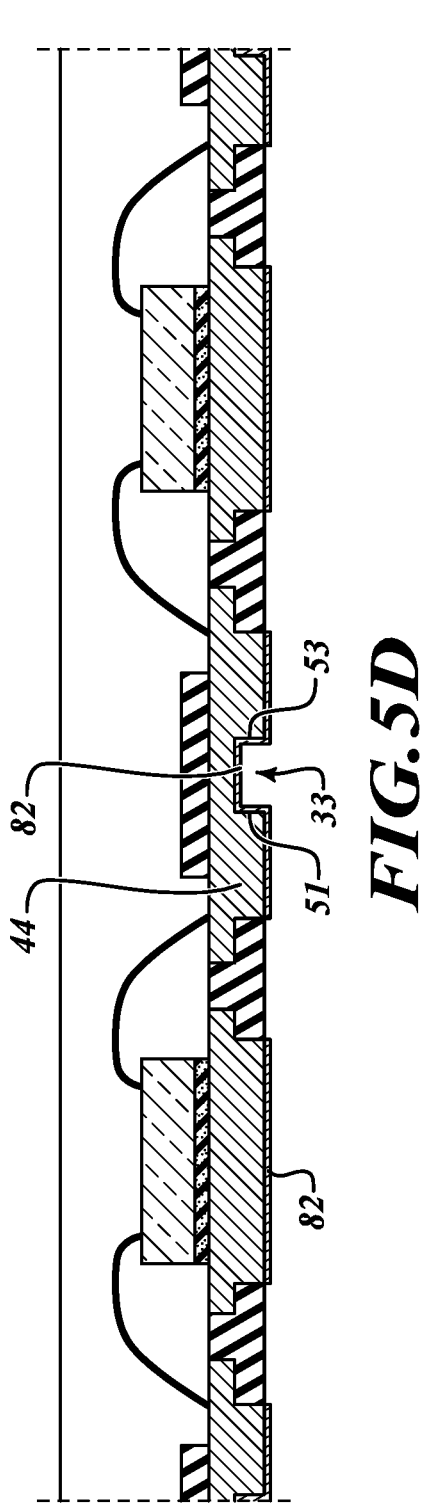

An exemplary embodiment of a method of manufacturing the leadframe package 70 with solder wettable sidewalls that is formed using a pre-molded leadframe is shown in Figures FIG. 5A-E. The process begins in FIG. 5A with the pre-molded leadframe 30. The pre-molded leadframe 30 has the plurality of die pads 42 and the plurality of leads 44 with each of the plurality of leads 44 comprising the first lead 48 and the second lead 50. The pre-molded leadframe 30 further includes the first plurality of molding compound portions 40 and the second plurality of molding compound portions 46, formed according to embodiments of the present disclosure. In the embodiment of FIG. 5A, the layer 82 has not yet been formed, but will be formed later.

In FIG. 5B, a plurality of die 72 are coupled to the plurality of die pads 42. The plurality of wires 76 are coupled between each die and one or more of the plurality of leads 44.

As illustrated in FIG. 5C, the encapsulant 84 is formed over the plurality of die 72, the plurality of wires 76 and the second plurality of molding compound portions 46. In some embodiments, the encapsulant 84 also contacts or covers a surface of the first plurality of molding compound portions 40. The array of packages are then removed from the mold.

After removal from the mold, the metal layer 82 is formed on any exposed metal surface of the array. Thus, it will be formed on each of the plurality of die pads 42 and each of the plurality of leads 44, including the sidewall of the leads, as in FIG. 5D. The metal layer 82 extends to the plurality of recesses 33 and covers a first side 51 and a second side 53 of each of the plurality of recesses 33.

Figure 5E:
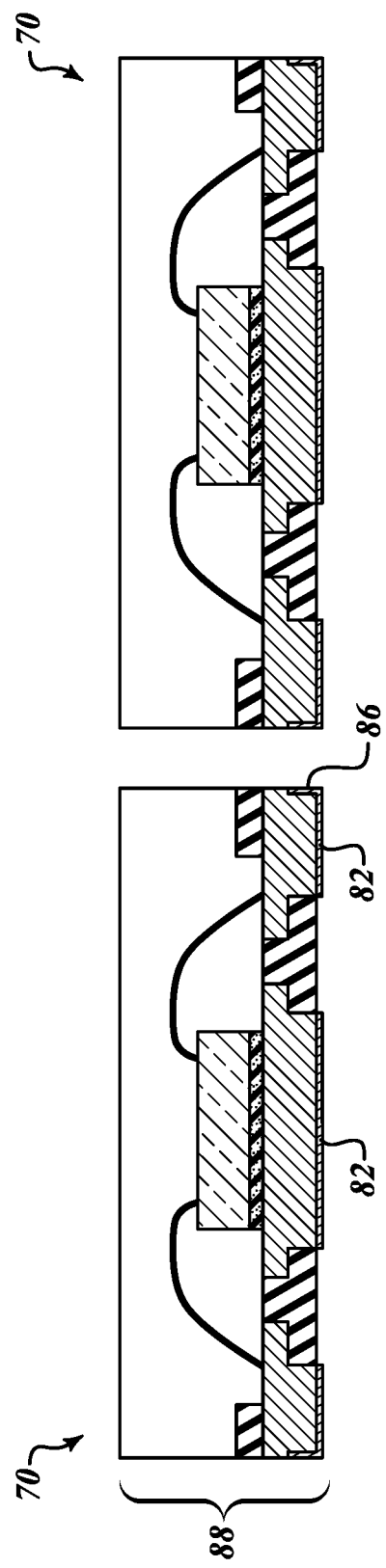

After the layer 82 is formed, a mechanical blade or other cutting means is used to singulate the resulting array to obtain individual packages 70, as in FIG. 5E. Each leadframe package 70 has a sidewall 88 with a portion 86 covered by the metal layer 82. This allows for solder joints to form between the sidewall 88 of the package and the PCB or other circuit board, resulting in a more reliable package that is inspected by AVI, the advantages of which have already been described.

In an alternative exemplary embodiment, the leadframe package 70 has the lead sidewall 85 without the flange 83 where the metal layer 82 covers the entire lead sidewall 85. In this embodiment, a tie bar is attached to a leadframe before processing in order to prevent leadframe bending or bouncing during processing. Then, the leadframe with the tie-bar attached can be cut all the way through at the plurality of recesses 33 to form the first lead 48 and the second lead 50 of each of the plurality of leads 44 and a second plurality of apertures between the first lead 48 and the second lead 50. The resulting leadframe having the second plurality of apertures is placed in the bottom mold tool 58, with the ridges 62 having a height sufficient to occupy the second plurality of apertures.

Then, the second plurality of recesses 68 are formed with a depth that corresponds to the second plurality of molding compound portions 46 having a sufficiently thick cross-section to support the leads 48 and 50 during processing. Then, the pre-molding and package formation processes continues according to the present disclosure until the tie bar is removed with a trimming machine or other cutting means prior to singulation of the respective packages. After singulation, the leadframe package 70 has the lead sidewall 85 that is covered with the metal layer 82. This increased contact surface area allows for stronger solder joints to form between the package 70 and the PCB or other circuit board, which improves reliability and further reduces resistance compared to a package with the metal layer 82 on only a portion 86 of the sidewall 85.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a pre-molded leadframe by:
      positioning a first side of a leadframe on a first mold tool, the leadframe having a plurality of first recesses and a plurality of apertures, each first recess of the plurality of first recesses having a size and a shape configured to receive one of a plurality of ridges of the first mold tool, the leadframe also having a plurality of die pads and a plurality of leads;
      positioning a second mold tool on a second side of the leadframe, the second mold tool having a plurality of second recesses;
      forming a plurality of first molding compound portions in the plurality of apertures; and
      forming a plurality of second molding compound portions in the plurality of second recesses.

2. The method of claim 1, further comprising positioning a mold release film on a first surface of the of the first mold tool prior to positioning the first side of the leadframe on the first mold tool.

3. The method of claim 2, wherein positioning the first side of the leadframe on the first mold tool includes positioning the leadframe on the mold release film.

4. The method of claim 2, wherein the mold release film is a non-adhesive material configured to prevent the leadframe from adhering to the first mold tool when forming the plurality of first molding compound portions and forming the plurality of second molding compound portions.

5. The method of claim 1, wherein forming the plurality of first molding compound portions and forming the plurality of second molding compound portions includes forming the plurality of first molding compound portions and the plurality of second molding compound portions in a single molding step.

6. The method of claim 1, wherein forming each first molding compound portion of the plurality of first molding compound portions in the plurality of apertures further comprises:
   forming a first portion having a first dimension extending from one of the plurality of die pads to one of the plurality of leads; and
   forming a second portion having a second dimension extending from one of the plurality of die pads to one of the plurality of leads, the second dimension being less than the first dimension.

7. The method of claim 1, wherein forming the plurality of second molding compound portions in the plurality of second recesses further comprises:

forming the plurality of second molding compound portions extending from one of the plurality of leads to another of the plurality of leads.

8. A device, comprising:
a leadframe including a first surface, a second surface opposite the first surface, a die pad, and a first lead;
a first molding compound portion between the die pad and the first lead, the first molding compound portion including a third surface substantially co-planar with the first surface, and a fourth surface substantially co-planar with the second surface;
a second molding compound portion on the first surface of the lead; and
an encapsulant on the first surface of the leadframe, on the third surface of the first molding compound portion, and on the second molding portion.

9. The device of claim 8, wherein the first molding compound portion includes:
a first portion with a first dimension extending from the first lead to the die pad; and
a second portion with a second dimension extending from the first lead to the die pad, the second dimension being less than the first dimension.

10. The device of claim 8, further comprising:
a second lead of the leadframe spaced apart from the die pad, the second lead of the leadframe separated from the first lead by the die pad; and
a third molding compound portion between the die pad and the second lead, the third molding compound portion having a fifth surface substantially co-planar with the first surface, and a sixth surface substantially co-planar with the second surface.

11. The device of claim 10, wherein the first molding compound portion and the second molding compound portion include:
a first portion with a first dimension extending from the first lead to the die pad; and
a second portion with a second dimension extending from the first lead to the die pad, the second dimension being less than the first dimension.

12. The device of claim 11, further comprising:
a metal layer on the first surface and the second surface of the leadframe, the metal layer partially covers a first side surface of the first lead and a second side surface of the second lead, the first side surface and the second side surface being transverse the first surface and the second surface of the leadframe.

13. The device of claim 8, further comprising:
a metal layer on the first surface and the second surface of the leadframe, the metal layer partially covers a side surface of the first lead, the side surface is transverse the first surface and the second surface of the leadframe.

14. The device of claim 8, further comprising:
a die coupled to the die pad, the die covered in the encapsulant; and
an electrical connection coupling the die to the first lead, the electrical connection having an end adjacent to the second molding compound portion.

15. The device of claim 8, further comprising:
a metal layer on the second surface of the leadframe, the metal layer partially covers a side surface of the first lead, the side surface is transverse the first surface and the second surface of the leadframe.

16. A device, comprising:
a leadframe including:
a first surface and a second surface opposite the first surface;
a die pad; and
a first lead including a first flange, the first flange including a first exposed surface transverse the first surface and the second surface;
a first molding compound portion separates the die pad from the first lead;
a second molding compound portion on the first surface of the leadframe and on the first lead; and
an encapsulant on the first surface of the leadframe, on the first molding compound portion, and on the second molding compound portion.

17. The device of claim 16, further comprising:
a second lead including a second flange, the second flange including a second exposed surface transverse the first surface and the second surface of the leadframe.

18. The device of claim 17, further comprising:
a first metal layer on a first side surface of the first lead, the first side surface is transverse the first surface and the second surface of the leadframe, the first metal layer includes a third exposed surface substantially co-planar with the first exposed surface of the first flange; and
a second metal layer on a second side surface of the second lead, the second side surface is transverse the first surface and the second surface of the leadframe, the second metal layer includes a fourth exposed surface substantially co-planar with the second exposed surface of the second flange.

19. The device of claim 16, further comprising:
a first metal layer on a first side surface of the first lead, the first side surface is transverse the first surface and the second surface of the leadframe, the first metal layer includes a third exposed surface substantially co-planar with the first exposed surface of the first flange.

20. The device of claim 16, wherein:
the first molding compound portion has a T-shape, and
the second molding compound portion has a second exposed surface transverse the first surface and the second surface of the leadframe, the second exposed surface is substantially co-planar with the first exposed surface of the first lead.

* * * * *